Sept. 10, 1968 P. L. HUNTER 3,401,326
THREE PHASE INVERTER CIRCUIT HAVING THREE STAGE RING COUNTER AND POWER INVERTERS WITH FERRO-RESONANT WAVE SHAPING CIRCUITS
Filed March 11, 1966 6 Sheets-Sheet 1
FIG. 2 OSCILLATOR 200
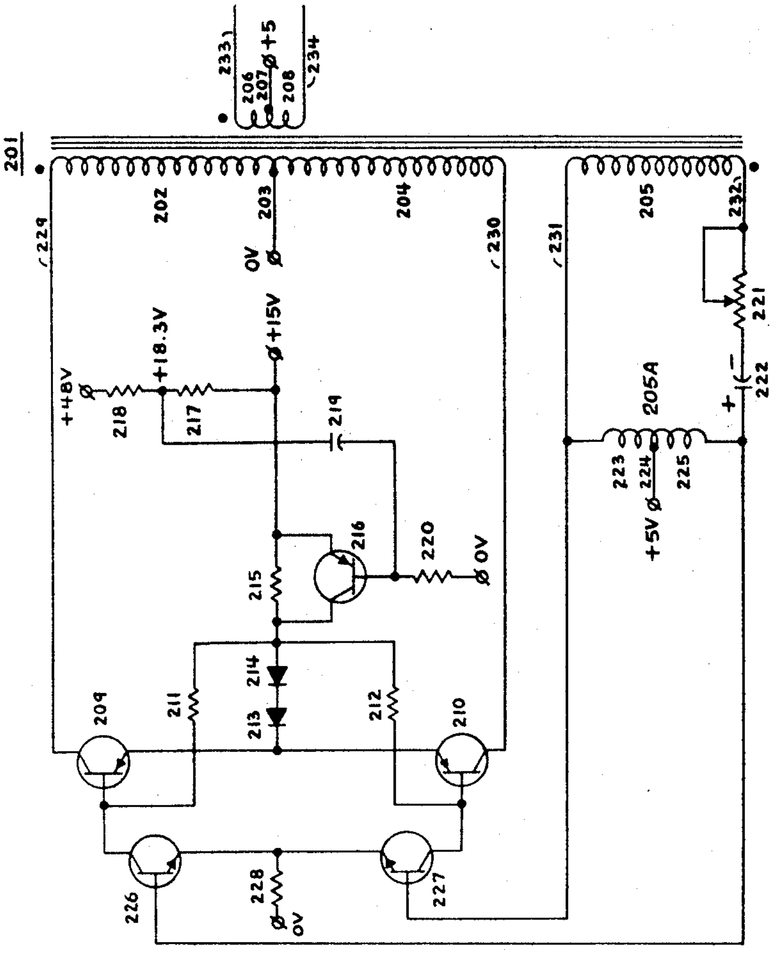
FIG. 1 D.C. POTENTIAL SUPPLY 100
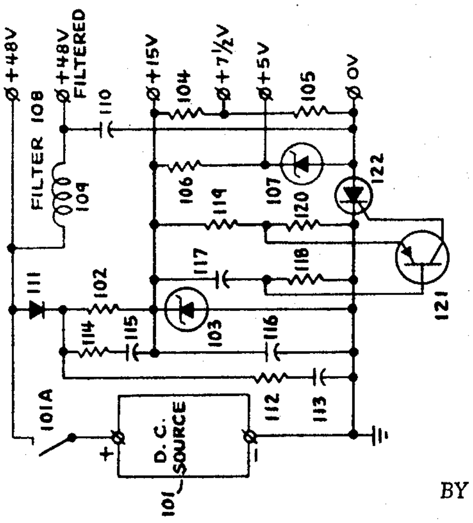
INVENTOR
Patrick L. Hunter
BY Brown Jackson Boettcher & Dienner
ATTORNEYS.

THREE PHASE INVERTER CIRCUIT HAVING THREE STAGE RING COUNTER AND POWER INVERTERS WITH FERRO-RESONANT WAVE SHAPING CIRCUITS
Filed March 11, 1966 6 Sheets-Sheet 2
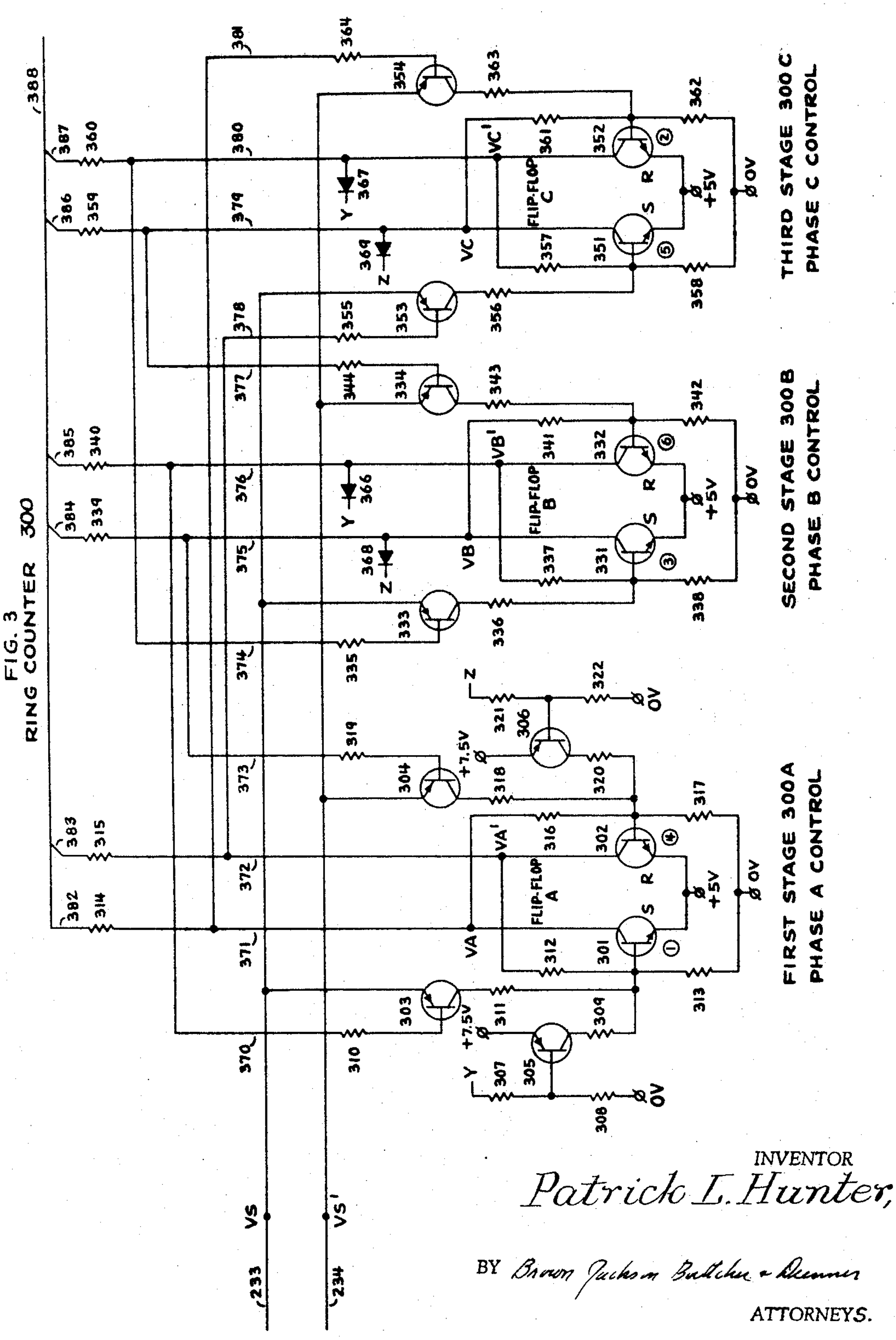
FIG. 3 RING COUNTER 300
INVENTOR
Patrick L. Hunter,
BY Brown Jackson Boettcher & Dienner
ATTORNEYS.

POWER AMPLIFIERS 400

INVENTOR
Patrick L. Hunter,

BY Brown Jackson Boettcher & Dienner
ATTORNEYS.

INVENTOR
Patrick L. Hunter
BY Brown Jackson Boettcher & Dienner
ATTORNEYS.

INVENTOR
Patrick L. Hunter

BY Brown Jackson Boettcher & Dienner
ATTORNEYS.

THREE PHASE INVERTER CIRCUIT HAVING THREE STAGE RING COUNTER AND POWER INVERTERS WITH FERRO-RESONANT WAVE SHAPING CIRCUITS

Filed March 11, 1966 6 Sheets-Sheet 6

INVENTOR
Patrick L. Hunter,

BY Brown Jackson Boettcher & Dienner
ATTORNEYS.

United States Patent Office 3,401,326

Patented Sept. 10, 1968

3,401,326

THREE PHASE INVERTER CIRCUIT HAVING THREE STAGE RING COUNTER AND POWER INVERTERS WITH FERRO-RESONANT WAVE SHAPING CIRCUITS

Patrick L. Hunter, Worthington, Ohio, assignor to North Electric Company, Galion, Ohio, a corporation of Ohio Filed Mar. 11, 1966, Ser. No. 533,541

1 Claim. (Cl. 321—5)

ABSTRACT OF THE DISCLOSURE

Three phase inverter circuit including a three-stage ring counter driven by an oscillator which provides a square wave drive via direct current coupling to the ring counter, a power inverter for each stage of said counter circuit, a ferroresonant wave shaper circuit for each power inverter connected to provide a three phase sine wave output, each wave shaper circuit comprising a first and a second core, a primary and a secondary winding being located on the first core, a first winding on the second core being connected across the secondary winding on the first core, and a series circuit including a capacitor and a second winding on the second core being connected across the secondary winding on the first core.

This invention relates generally to electrical power conversion systems, and more specifically to a three-phase inverter which converts direct current into alternating current.

Inverters which change direct current into alternating current have many uses well known in the field. In its most basic application, the inverter, derives power from a direct current source, such as a battery, and provides a source of alternating current at its output side. Such output is frequently used as a stand-by source in the event of failure of the commercial A.C. current source.

It is an object of the invention to provide a novel combination including a novel ring counter driven by an improved oscillator which provides a square wave drive having extremely fast rise and fall times over a two conductor drive connected directly to the inputs of each of the novel stages in the ring counter, whereby a square wave having fast rise and fall times is provided at the output of the ring counter every 120°.

It is yet another object of the invention to provide an inverter which includes ring counter means having a plurality of switching stages, each stage including two transistor AND gates and a transistor flip-flop connected to provide a square wave output waveform every 120°, each stage further including only direct current coupling between its switching elements and the equipment which is operated thereby, and oscillator means for directly coupling square waves to the stages of the counter, whereby capacitor coupling is eliminated to, in, and from the counter means.

It is a specific object of the present invention to provide a system comprising a direct-current power supply, a transistor-transformer oscillator energized by the power supply to drive a three-stage transistor ring counter, each stage of which in turn drives a power amplifier, a power inverter, and a ferroresonant wave shaping circuit to provide a three phase sine wave output, the output of each stage comprising a different one of the sine wave alternating current phases. The direct current potential supply provides power for the oscillator, ring counter, and power amplifiers, and additionally provides filtered power for the power inverters to minimize feedback of noise to the direct current source. Protection means including capacitor means in the filter section is effective upon start to provide a filtered potential of gradually increasing value to the power inverters and thereby additional protection for the components of the system. Use is made of the charging period of the capacitor means in the direct current potential supply to control the gradual increase in amplitude of voltage applied to the power inverter for the purpose of protecting the semiconductor elements associated therewith from damage during the initial starting period.

These and other objects, advantages and features of the invention will be apparent to those skilled in the art from the following detailed description, taken in conjunction with the accompanying drawings, in which:

FIGURE 1 illustrates a direct current potential supply including a filter containing a capacitor and inductor means for controlling the amplitude of voltage upon start and other filtered bias supplies for control circuits;

FIGURE 2 illustrates an an oscillator including resistance control means for controlling the frequency of signals upon start;

FIGURE 3 illustrates a three-stage ring counter;

Figure 7A:
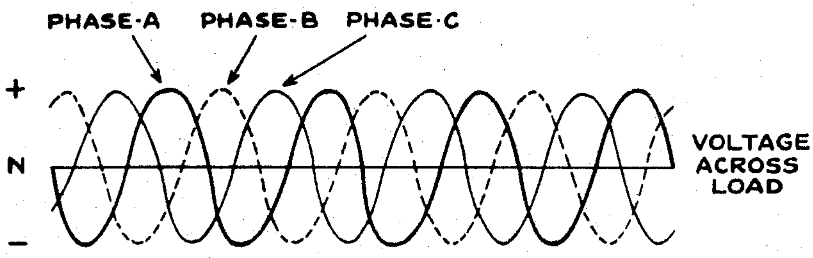
Figure 7B:
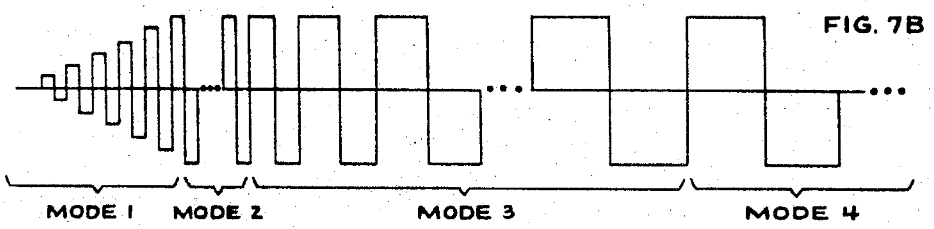
Figure 7C:
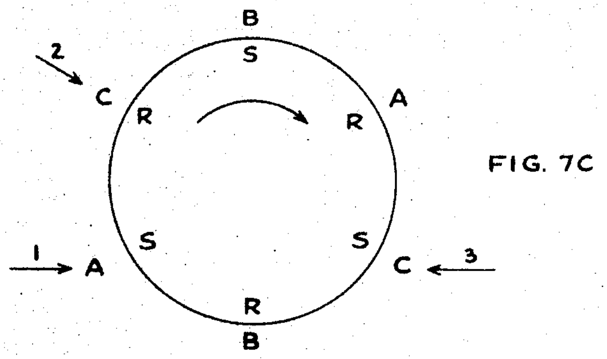

FIGURE 7A comprises waveforms illustrating the three-phase alternating current voltage across the load;

FIGURE 7B sets forth waveforms illustrating four modes of operation of the power inverters including variable amplitude and frequency square wave signal control to the power inverters during starting; and FIGURE 7C is a diagram illustrating the sequence of setting and resetting of the flip-flops of FIGURE 3 as the ring counter progresses responsive to drive by the oscillator of FIGURE 2.

DESCRIPTION

*D.C. potential supply—FIGURE 1*

With reference to FIGURE 1, therein is illustrated a D.C. potential supply 100 which includes a 48 volt D.C. source 101, such as a battery. The negative terminal of source 101 which may be connected to ground, is considered to be the 0 volt reference point and is extended over SCR 122 to the inverter equipment as the 0 volt terminal. The positive terminal of source 101 is connected via manual switch 101A to the +48 volt terminal leading to the inverter equipment.

The supply source 100 further supplies a constant voltage of +15 volts for the equipment by means of a diode 111, a resistor 102 and a 15 volt Zener diode 103 which are connected between the +48 volts and 0 volts supply conductors from source 101.

Resistors 104 and 105 connected between the +15 volts and 0 volts conductors are of equal value to provide a constant voltage at their junction of 7½ volt which is extended over the 7½ volt lead to the equipment.

A constant voltage over +5 volt terminal is supplied to the equipment by resistor 106 and 5 volt Zener diode 107 which are connected between +15 volts and 0 volts.

A filter 108 comprising inductor 109 and capacitor 110 is connected between the +48 volts and 0 volts supply conductors whereby the conductor connected to the junction between the inductor 109 and capacitor 110 provides filtered +48 volts to the +48 volt terminal for the inverter equipment.

Capacitor 116 connected across Zener diode 103 provides a path to ground for ripple current drawn by the power amplifiers. With closure of switch 101A however, this capacitance across diode 103 delays the establishment of the +15 volt control potential. Accordingly, resistor 114 and capacitor 115 across resistor 102 provide a lower impedance path for current upon start to compensate for the slowing effect of capacitor 116.

Silicon controlled rectifier 122 holds ground from the 0 volt terminal, upon start, until the +15 volts has been established, transistor 121 being connected to withhold current from the gate electrode of 122 until such time as the +15 volt potential has been established. More specifically, transistor 121 has its emitter connected to the common point between resistors 119 and 120 which are connected in series between the +15 volt terminal and ground. Transistor 121 also has its base connected to the common point between capacitor 117 and resistor 118 connected in series between the +15 volt terminal and ground. As a result transistor 121 is turned off until capacitor 117 charges. As capacitor 117 is charged, transistor 121 conductors, and turns SCR 122 on after approximately 120 micro-seconds, which is in the early part of the charging stage of capacitor 110.

A series circuit comprising a one ohm resistor 112 and capacitor 113 is connected from the common point between diode 111 and resistor 102 to ground. When the switch 101A is opened with the oscillator running, the discharging of capacitor 113 maintains the +15 v. and +7½ v. potential while condenser 110 is discharging and the filtered +48 volts is reducing, and thereafter permits the +15 v., +7½ v., and +5 v. to reduce. In this manner the flux in transformers 528, 558 and 588 is essentially reduced to zero to provide another factor in keeping the flux in these transformers at a lower level during subsequent start up in response to closure of switch 101A.

*Oscillator—FIGURE 2*

The basic circuitry of oscillator 200 (FIGURE 2) is shown and described in United States patent application filed by Patrick L. Hunter on Jan. 20, 1964, having Ser. No. 338,886 and assigned to the assignee of the present invention. The oscillator, as there taught, provides a square wave output at a stable frequency.

The oscillator 200 is a low power transistor inverter comprising a first pair of transistors 209 and 210, a pair of windings 202 and 204 on a transformer 201 connected in the collector circuits of transistors 209, 210, a pair of series rectifiers 213 and 214 connected in the base emitter circuit of the transistors 209, 210, and a pair of base resistors 211 and 212.

The feedback circuit comprises a winding 205 on transformer 201 which provides an alternating feedback voltage over conductors 231, 232 to a circuit including inductor 205A connected across winding 205 via capacitor 222 and variable resistor 221. Inductor 205A, capacitor 222, and variable resistor 221 determine the steady state operating frequency for the signal oscillator 200. That is, conductors 231, 232 are further connected to the base circuits of transistors 226, 227 and the alternating voltage across the terminals of 205A provides the required drive for transistors 226 and 227 which operate in a differential amplifier mode to in turn control the operation of transistors 209 and 210 in the oscillator mode.

Potentiometer 221 is used for minor adjustments of the steady state operating frequency, the highest operating frequency being obtained with all the resistance of 221 in the circuit, and the lowest operating frequency being obtained with all of the resistance 221 removed from the circuit.

When switch 101A in power supply 100 (FIGURE 1) is closed to energize the various voltage terminals, according to the novel invention, the oscillator 200 must initially operate at a higher frequency than that determined by inductor 205A, capacitor 222 and resistor 221, and thereafter at a gradually decreasing frequency until the normal steady state frequency value is reached. It should be observed that the insertion of an additional amount of resistance in the feedback circuit would cause the desired increase in operating frequency.

For the purpose of effecting operation of the oscillator at the higher frequency during the initial operating mode there is provided a high frequency start circuit consisting of a voltage divider including resistors 217, 218, a start control capacitor 219, a switching transistor 216 and associated resistors 215, 220.

Capacitor 219 initially has no charge on its plates when switch 101A of power supply 100 is closed, and the base of transistor 216 will be essentially at the same voltage level as the point between resistors 217 and 218 (i.e., approximately +18.3 volts). Therefore, since the emitter is tied to +15 volts and the base is at +18.3 volts the base to emitter of PNP transistor 216 is initially back-biased.

With transistor 216 back-biased, the transistor is in the non-conducting state, and the impedance from emitter to collector is determined basically by resistor 215. By impedance transformation through transformer 201, windings 202, 204, and 205, resistance 215 causes the total reflected resistance in the feedback circuit to be larger than normal, therefore causing the oscillator of operate at a higher frequency.

With closure of switch 101A, capacitor 219 charges over a path extending from +48 v. over resistors 218 and 220 to 0 volts. The back-bias of emitter-base circuit of transistor 216 decreases and ultimately becomes forward biased, allowing transistor 216 to gradually assume a conducting state to, in effect, short resistor 215. This gradual decrease in the combined resistance of resistor 215 and the emitter-to-collector impedance of transistor 216 is reflected into the feedback circuit associated with winding 205, resulting in a gradual decrease in the frequency to the value determined by inductor 205A, capacitor 222 and resistor 221. The novel circuit thus provides a higher starting frequency with an automatic gradual decrease to the steady state operating frequency for a purpose to be more fully described.

Resistances 217, 218 and 220 and capacitance 219 are selected to obtain the desired time constant for the change in operating frequency of the oscillator 200. Additionally, resistance 220 must be selected to maintain transistor 216 in a conducting state during steady state operation; and the divider network comprising resistors 217 and 218 in conjunction with the difference voltage, +48 volts minus +15 volts, is selected to provide the proper reverse bias on transistor 216 which is initially required. Resistance 215 determines the amount of actual frequency change to be obtained.

An oscillator 200 having components of the values set forth hereinafter has a nominal steady state operating frequency of 180 cycles per second, which is adjustable by means of variable resistor 221. Initially, using the value of resistor 215 specified hereinafter, the starting frequency of the signal oscillator 200 is approximately 206 cycles per second for approximately 200 ms. which frequency gradually decreases to 180 cycles per second in about 50 milliseconds.

The transistors of oscillator 200 are biased as shown, transistors 209 and 210 being slightly back-biased by diodes 213 and 214. Resistors 211 and 212 provide paths for leakage currents from transistors 209, 210, 226 and 227.

The operation of the oscillator circuit 200 during steady state operation is now set forth. As a starting point it will be assumed that transistors 226 and 209 have just switched on. A circuit can then be traced from +15 volt over the low resistance of the emitter-collector path of transistor 216 essentially, rectifiers 214 and 213, the emitter-collector path of transistor 209, lead 229, winding 202, and center tap 203 to 0 volts, making the top terminal end of primary winding 202 + and the bottom terminal end thereof —, the top terminal end of primary winding 204 + and the bottom terminal end thereof —, the top terminal end of secondary winding 206 + and the bottom terminal end —, the top terminal end of secondary winding 208 + and the bottom terminal end thereof —, and the bottom terminal end of winding 205 + and the top thereof —.

Just prior to switching of the transistors 226, 209, capacitor 222 will have been charged to approximately the same voltage as exists across winding 205 so that when switching of the transistors occurs the voltage across the capacitor 222 is additive to the voltage across the windings 205 and the sum of these voltages appears abruptly across inductor 205A, the lower end of inductor 205A being positive and the upper end being negative.

This positive potential further biases transistor 226 in the conducting state; and the negative potential further biases transistor 227 in the cut-off state.

Increased current flows in the path extending from +15 volts, over diodes 214 and 213, the emitter-base path of transistor 209, the collector-emitter path of transistor 226, and resistor 228 to 0 volts, causing transistor 209 to be further biased in the conducting state.

Due to the current flow in inductor 205A, capacitor 222 continues to charge slightly; discharges; and charges in the reverse direction toward the voltage across winding 205.

During this discharging and charging in the reverse direction, the potential across inductor 205A decreases, and the upper end approaches +5 volts from the negative side, and the lower end approaches +5 volts from the positive side.

When capacitor 222 has almost charged to the potential across winding 205, and accordingly the voltage across inductor 205A has almost vanished, transistor 227 begins turning on, in turn causing transistor 210 to begin to turn on.

A circuit can then be traced from 15 volts over the emitter-collector path of trasistor 216, diodes 214 and 213, the emitter-collector path of transistor 210, lead 230, winding 204, and center tap 203 to 0 volts whereby a voltage decrease across winding 204 results in a decrease in the voltage across winding 202, resulting in a decrease of voltage in winding 205. This permits the charge on capacitor 222 to equal the voltage across winding 205 whereby the voltage across the inductor 205A vanishes, both upper and lower ends becoming +5 volts at which point both transistors 226 and 227 are conducting momentarily. The increased conduction of transistor 227 causes increased conduction in transistor 210, causing an increased voltage across winding 204 in opposition to the voltage across winding 202. This causes the voltage across winding 205 to decrease rapidly to zero and reverse to create a potential across inductor 205A with the upper end positive and the lower end negative whereby transistor 227 is further biased into conduction and transistor 226 is turned off, in turn turning transistor 209 off. Abruptly, therefore, a potential develops across inductor 205A equal to the sum of the voltages across capacitor 222 and winding 205.

Due to the current flow in inductor 205A, capacitor 222 continues to charge slightly; discharges; and then charges in the reverse direction toward the voltage across winding 205.

During this discharging and charging in the reverse direction, the potential across inductor 205A decreases, the lower end approaching +5 volts from the negative side and the upper end approaching +5 volts from the positive side.

When capacitor 222 has almost charged to the potential across winding 205 (and accordingly the voltage across inductor 205A has almost vanished), transistor 226 begins turning on, in turn causing transistors 209 to begin turning on, whereby a voltage across winding 202 opposes the voltage across winding 204, resulting in a decrease of voltage in winding 205. This permits the charge on capacitor 222 to equal the voltage across winding 205 whereby the voltage across the inductor vanishes, both the upper and lower ends becoming +5 volts. At this point both transistors 226 and 227 are conducting momentarily. The increased conduction of transistor 226 causes increased conduction in transistor 209, causing an increased voltage across winding 202 in opposition to the voltage across winding 204. This causes the voltage across winding 205 to decrease rapidly toward zero and to reverse to thereupon create a potential across inductor 205A with the lower end positive and the upper end negative. Transistor 226 is thereupon further biased into conduction and transistor 227 is turned off, in turn turning transistor 210 off. Abruptly, therefore, a potential develops across inductor 205A equal to the sum of the voltages across capacitor 222 and winding 205.

This operation of oscillator 200 results in a very square voltage wave having extremely fast rise and fall times (FIGURE 6G) at point VS of FIGURE 3; and a square voltage wave of like characteristics (FIGURE 6H) at point VS' of FIGURE 3, the wave at VS as evidenced by the figures being 180° out of phase with the wave at VS'. The voltage waves at both VS and VS', by reason of the start circuit described above, will exhibit a higher frequency upon start, and a gradually decreasing frequency thereafter until the steady state frequency is reached.

*Ring counter—FIGURE 3: Three phase square wave generator*

The output of oscillator 200 which appears on conductor VS, VS' is fed to a ring counter 300 (FIGURE 3) for use in generating three phase current. The ring counter 300 basically comprises a first stage 300A which exercises phase A control, a second stage 300B which exercises phase B control, and a third stage which exercises phase C control.

Each stage such as the first stage 300A comprises a flip-flop, such as flip-flop A, which has a set transistor, such as transistor 301, a reset transistor such as 302, a first AND gate, such as transistor 303, for setting the flip-flop, and a second AND gate such as transistor 304, for resetting the flip-flop.

The first stage also has associated therewith two transistors 305 and 306 with inputs thereto from the other two stages, the purpose of which will be set forth hereinafter.

The functions of the ring counter in its operation are to generate a three-phase square wave signal source having fast rise and fall times for use in a three-phase inverter circuit, and further to generate three-phase signals which have stable phase shifts of 120 degrees. Additionally, the ring counter must provide a three-phase signal source which can be operated over a wide range of frequencies while maintaining constant relative phase shifts of 120 degrees between the three output waveforms.

Each of the alternating input signals over conductors VS and VS' (referred to hereinafter as signals VS, VS') is a square wave which oscillates at a frequency three times that of the waveforms which are provided at the output terminals (FIGURE 5) of the inverter. At each polarity reversal of VS and VS', one of the output waveforms switches from one stable state to another providing waveforms which are shifted in time by integral multiples of the period of the input waveform. The phase shifts in degrees are therefore independent of the frequency of the oscillator 200, and depend only upon the symmetry of the input waveforms from the oscillator.

With reference now to the first stage 300A, it will be seen that the basic bistable circuit includes transistors 301 and 302 which provide output signals VA and VA' at the collectors of 301 and 302. Resistors 313 and 315 are collector load resistors, resistors 313 and 317 provide reverse bias current, and resistors 312 and 316 provide forward bias current.

Transistors 301 and 302 operate in a switching mode between two stable states in saturation and cutoff. That is, it is first assumed that transistors 303 and 304 are in the cut-off state and that their collector currents are zero. If transistor 301 is in a saturated state, the collector of 301 drops to a potential of about +5.5 volts, which is about 0.5 volt above the emitter potential. The current supplied through resistor 317 drops the base potential of transistor 302 below +5 volts, providing reverse base to emitter voltage to transistor 302 resulting in a cut off state for transistor 302. The collector potential of 302 rises and forward bias current to the base of transistor 301 is supplied through resistors 315 and 312. The transistors remain in this stable state providing transistors 303 and 304 remain in the cut-off state.

If transistor 304 switches into a conductive state, the collector current flows through resistor 31B and raises the base potential of transistor 302 above +5 volts. Transistor 302 switches into conduction, and removes the forward bias current from the base of 301, resulting in a cut-off state for 301. The collector potential of 301 rises and forward bias current is supplied to the base of 302 through resistors 314 and 316. If transistor 304 switches into a cut-off state, transistors 301 and 302 remain in the same stable state.

The emitters of transistors 303 and 304 are connected to the VS and VS′ inputs from the transformer coupled square wave oscillator 200. The base of transistor 303 is connected over resistor 310 to the collector of transistor 332 in the second stage 300B, and the base of transistor 304 is connected over resistor 319 to the collector of transistor 331 in the second stage 300B.

If a positive signal with respect to +5 volts exists on conductor VS, and transistor 332 is in a saturated state, forward base current is supplied to transistor 303 through resistor 310 and transistor 303 saturates. The current supplied by the collector of 303 flows through resistor 311 and applies forward base current to transistor 301. If, as assumed, VS has a positive signal with respect to +5 volts (about 5 volts more positive, i.e., making VS at about +10 volts), the VS′ will have a negative signal with respect to +5 volts (about 5 volts more negative and VS′ is at about 0 volts) making the emitter of transistor 304 more negative than its base. Transistor 304 remains in a cut-off state independent of the conduction state of transistor 331.

When VS′ becomes +10 volts, VS will be at 0 volts and transistor 303 is cut-off and transistor 331 is in the saturated state. Forward base current is therefore supplied through resistor 319 to transistor 304 resulting in the conductive state for 304. The current supplied by the collector of 304 through resistor 318 provides the necessary forward base current to transistor 302 and flip-flop A switches into its second stable state.

Second stage 300B and third stage 300C operate in the same manner. Second stage 300B obtains its gating signals through resistors 335 and 344 from the collectors of transistors 352 and 351 respectively in the third stage 300C. Similarly, the third stage 300C obtains its gating signals through resistors 355 and 364 from the collectors of transistors 302 and 301 respectively in the first stage 300A.

The squence in which the flip-flop transistors are driven into a saturated state is as follows: 301, 352, 331, 302, 351, and 332. This sequence produces three-phase signals VA, VB, and VC and three-phase signals VA′, VB′, and VC′ which are displaced 180 degrees therefrom.

Only two stages can be in the same stable state simultaneously. For example, if transistors 331 and 351 are in a saturated state, then transistor 301 must be in a cut-off state. Initial application of D.C. power to the circuitry may produce a condition in which all three stages switch into the same stable state, and improper operation could result for a few cycles. A condition of this type may cause serious problems when the ring counter is used as a driver for high power three-phase inverters.

To prevent such occurrence, transistors 305 and 306 and associated circuitry are connected to force the ring counter 300 into a correct stable state when D.C. power is applied. Thus, it should be observed that the base of transistor 305 is connected via resistor 307, lead Y and diodes 366 and 367 to the collectors of transistors 332 and 352 in the second and third stages. Also the base of transistor 306 is connected via resistor 321, lead Z and diodes 368 and 369 to the collectors of transistors 331 and 351. These circuits have no effect in the normal operation of the oscillator.

However, if transistors 332 and 352 are in a saturated state, diodes 366, 367 are back-biased by +7.5 volts via base emitter path of transistor 305, resistor 307 and the lead Y connections, and current will flow through resistor 308 and the emitter-base path of transistor 305, causing it to saturate.

If transistors 331 and 351 are in a saturated state, diodes 368 and 369 are back-biased by +7.5 volts via the base emitter of transistor 306, resistor 321 and lead Z connections whereby current is permitted to flow through resistor 322 and the emitter base path of transistor 306, and transistor 306 saturates.

If either or both transistors 332 and 352 are cut-off, the collector voltage of the cut-off transistor and current flow through resistor 307 raises the base potential of transistor 305 above the emitter potential which is +7.5 volts. Transistor 305 is cut-off and remains in this state provided either transistor 332 or 352 is cut-off. If transistors 332 and 352 saturate, diodes 366 and 367 are reverse biased and forward base current is supplied to transistor 305 through resistor 308 to 0 volts. The collector current passes through resistor 309 to the base of transistor 301 forcing it into the saturated state. Similar operation occurs for transistor 306 in response to gating signals from transistors 331 and 351.

The ring counter 300 can operate at any frequency within the frequency limitations of the transistors. No changes in circuitry are required to cover the wide frequency range and power levels normally encountered by inverter circuits in the field. High power inverters require a power amplifier stage between the three-phase generator and the output stage, which power gain can be achieved in many ways. In one embodiment, emitter follower transistor stages may be driven by the signals VA–VC′ and output from the ring counter 300. Another means of producing power gain is to drive switching circuits of the type shown in FIGURE 4. The collector currents of the flip-flop transistors provide base drive for either NPN or PNP transistors, such as 401, 402 in amplifiers such as 400A, 400B, 400C which drive silicon controlled rectifier inverters requiring fast rise and fall time waveforms.

As the oscillator 200 (FIGURE 2) oscillates, points VS and VS′ (FIGURE 3) alternately and very abruptly become positive (approximately 10 volts), causing the ring counter 300 to step cyclically in the order first stage, second stage, third stage, first stage, etc. With reference to FIGURE 7C (although the ring counter can start at any point when switch 101A is closed) if the counter starts at the point indicated by the amount $\overset{1}{\rightarrow}$ going around the circle clockwise, the sequence would be as follows: flip-flop A sets, flip-flop C resets, flip-flop B sets, flip-flop A resets, flip-flop C sets, flip-flop B resets, flip-flop A sets, etc. This sequence is further illustrated in FIGURE 3 by the encircled sequence numerals adjoining the flip-flop transistors.

When VS becomes positive, the emitters of AND gate transistors 303, 333, and 353 are biased for conduction, but only the transistor or transistors which have their bases forward biased by another flip-flop stage will conduct. Similarly when VS′ becomes positive, the emitters of AND gate transistors 304, 334, and 354 are biased for conduction, but only the transistor or transistors which have their bases forward biased by another flip-flop stage will conduct. 1

Starting at the point indicated by → in FIGURE 7C and assuming that the oscillator and ring counter are in operation, the sequence of operation is now set forth.

*(1) VS positive; flip-flop A sets*

When VS goes positive (1) transistor 334 becomes cut-off; (2) transistor 303 switches on (its base was previously placed close to +5 volts by transistor 332); (3) a circuit is completed from positive potential at point VS over the emitter-collector path of transistor 303, resistor 311, base-emitter path of transistor 301, to +5 volts, causing transistor 301 to conduct to saturation, whereby the collector of 301 causes the voltage at point VA to abruptly change from about +15 volts to approximately +5.5 volts. A circuit can be traced from +48 volts (FIGURE 4) over resistor 403, lead 382, cable 388 (FIGURE 3), lead 382, resistor 314, lead 371, point VA, the low resistance of the collector-emitter path of transistor 301 to +5 volts, whereby the base of transistor 401 becomes negative with respect to its emitter, causing transistor 401 to switch on.

Thus, with the change in the VA voltage: (1) transistor 401 switches on; (2) transistor 302 cuts-off to cause the VA′ voltage to go from about +5 volts to about +15 volts; and (3) transistor 354 is prepared via lead 371, lead 381, and resistor 364 to switch on.

The VA′ voltage change (1) via lead 372, resistor 315, lead 383, cable 388, lead 383, resistor 405 to +48 volts causes the base of transistor 402 to become more positive than the emitter, turning transistor 402 off; (2) provides forward bias current for transistor 301; and (3) raises the potential of the base of transistor 353, making it impossible for 353 to conduct when VS subsequently goes positive.

*(2) VS′ positive; flip-flop C resets*

When VS′ goes positive (1) transistor 303 becomes cut-off; (2) transistor 354 switches on, in turn causing transistor 352 to switch on; (3) which causes the VC′ voltage to go from about +15 volts to about +5 volts.

The VC′ voltage change (1) via lead 380, resistor 360, lead 387, and cable 388 causes transistor 462 to switch on; (2) cuts-off transistor 351 which causes the VC voltage to go from about +5 volts to about +15 volts; and (3) via lead 380, lead 374, and resistor 335 prepares transistor 333 to switch on.

The VC voltage change (1) turns transistor 461 off; (2) provides forward bias current for transistor 352; and (3) raises the potential of the base of transistor 334, making it impossible for 334 to conduct when VS′ subsequently goes positive.

*(3) VS positive; flip-flop B sets*

When VS goes positive (1) transistor 354 becomes cut-off; (2) transistor 333 switches on, in turn (3) causing transistor 331 to switch on which causes the VB voltage to go from about +15 volts to about +5 volts.

The VB voltage change (1) causes transistor 431 to switch on; (2) cuts-off transistor 332 which causes the VB′ voltage to go from about +5 volts to about +15 volts; and (3) prepares transistor 304 to switch on.

The VB′ voltage change (1) turns transistor 432 off; (2) provides forward bias current for transistor 331; and (3) raises the potential of the base of transistor 303.

*(4) VS′ positive; flip-flop A resets*

When VS′ goes positive (1) transistor 333 becomes cut-off; (2) transistor 304 switches on, (3) causing transistor 302 to switch on which causes the VA′ voltage to go from about +15 volts to about +5 volts.

The VA′ voltage change (1) causes transistor 402 to switch on; (2) cuts-off transistor 301 which causes the VA voltage to go from about +5 volts to about +15 volts; and (3) prepares transistor 353 to switch on.

The VA voltage change (1) turns transistor 401 off, (2) provides forward bias current for transistor 302, and (3) raises the potential of the base of transistor 354.

*(5) VS positive; flip-flop C sets*

When VS goes positive (1) transistor 304 becomes cut-off, (2) transistor 353 switches on, (3) in turn causing transistor 351 to switch on which causes the VC voltage to go from about +15 volts to about +5 volts.

The VC voltage change (1) causes transistor 461 to switch on, (2) cuts-off transistor 352 which causes the VC′ voltage to go from about +5 volts to about +15 volts, and (3) prepares transistor 334 to switch on.

The VC′ voltage change (1) turns transistor 462 off; (2) provides forward bias current for transistor 351, and (3) raises the potential of the base of transistor 333.

*(6) VS′ positive; flip-flop B resets*

When VS′ goes positive (1) transistor 353 becomes cut-off, (2) transistor 334 switches on, (3) causing transistor 332 to switch on which causes the VB′ voltage to go from about +15 volts to about +5 volts.

The VB′ voltage change (1) causes transistor 432 to switch on, (2) cuts-off transistor 331 which causes the VB voltage to go from about +5 volts to about +15 volts, and (3) prepares transistor 303 to switch on.

The VB voltage change (1) turns transistor 431 off. (2) provides forward bias current for transistor 332, and (3) raises the potential of the base of transistor 304.

When VS goes positive again, the cycle starts over again.

Figure 6A:
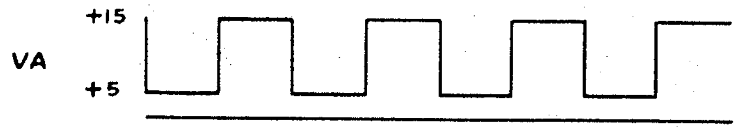
FIGURES 6A–6F illustrate the voltage waveforms at points VA-VC′ respectively of FIGURE 3.
Figure 6B:
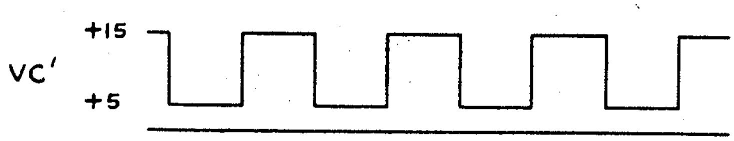
Figure 6C:
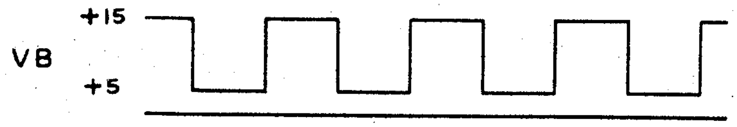
Figure 6D:
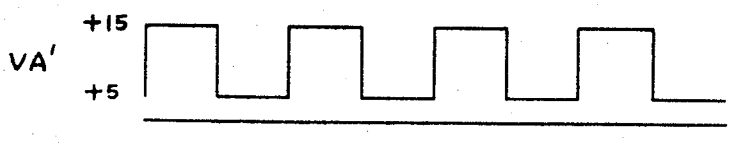
Figure 6E:
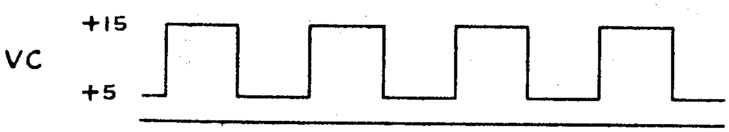
Figure 6F:
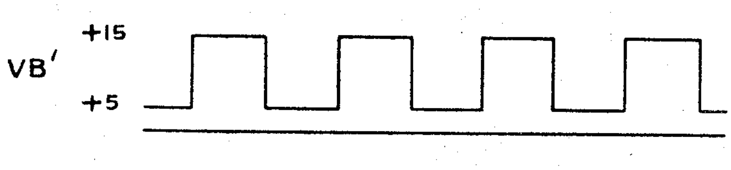
Figure 6G:
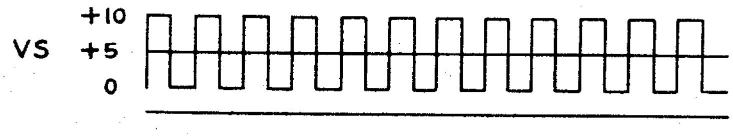
FIGURES 6G and 6H illustrate the waveforms at points VA–VC′ respectively of FIGURE 3.
Figure 6H:
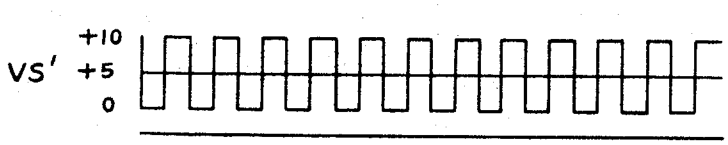

Referring to FIGURES 6A–6F, the square wave voltages produced at points VA–VC′ as a result of the VS and VS′ signals illustrated in FIGURES 6G and 6H are shown thereat. The vertical alignment of the FIGURES 6A–6H provides a graphical comparison of the relative timings of the signals.

*Power amplifiers (FIG. 4) and power inverters (FIG. 5)*

Figure 4:
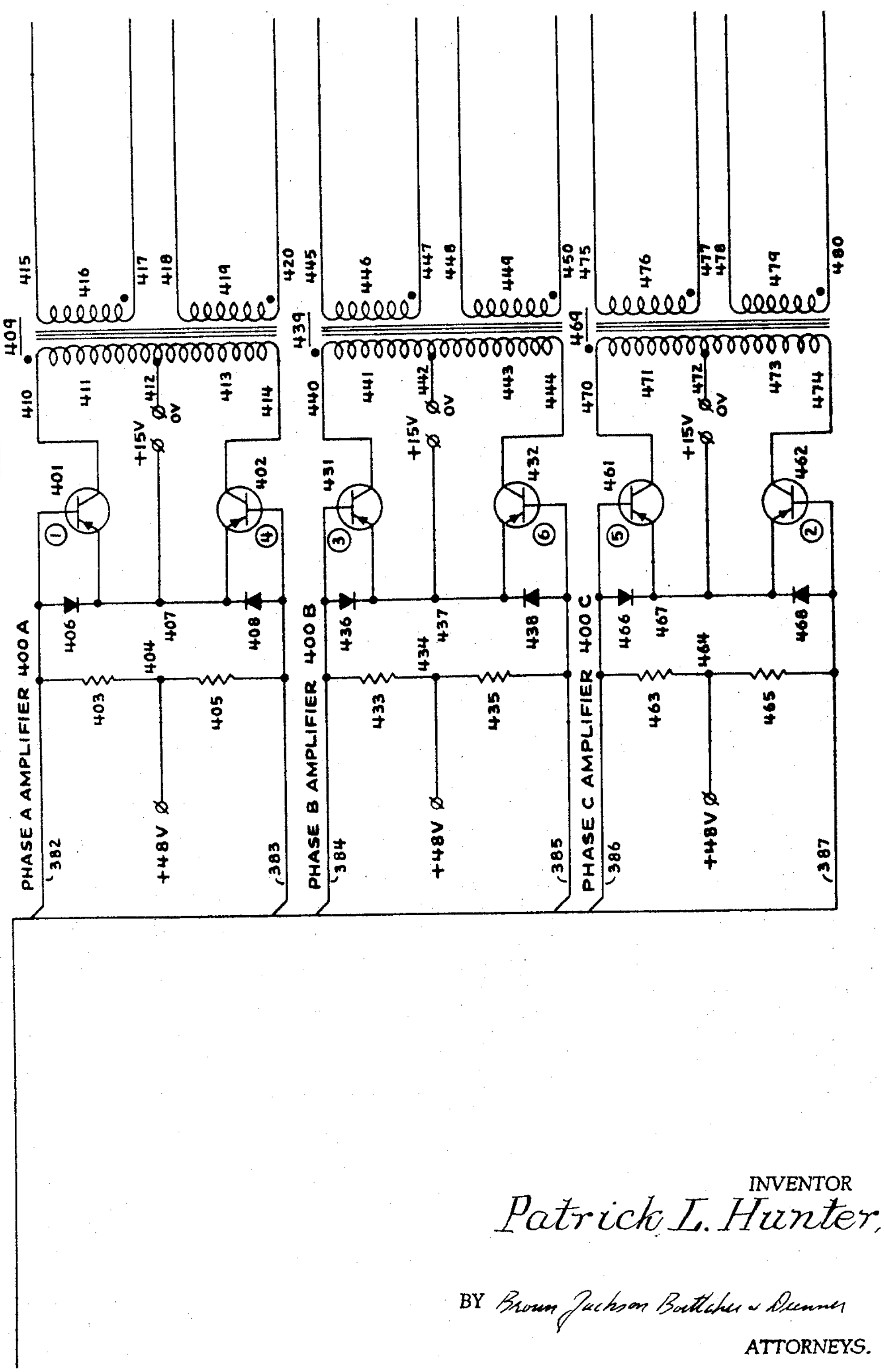
FIGURE 4 illustrates power amplifiers for the three phases.

As described in the previous section and as illustrated by the encircled sequence reference numerals adjacent the transistors of FIGURE 4, in response to incoming trains of square wave signals on leads 382–387, the sequence of switching on and off is as follows (+ is used to signify switch on and − to signify switch of):

| | |
|---|---|
| (1) +**401** −**402** | (4) +**402** −**401** |
| (2) +**462** −**461** | (5) +**461** −**462** |
| (3) +**431** −**432** | (6) +**432** −**431** |

When transistor 401 switches on, the emitter-collector path of 401 assumes a very low resistance abruptly placing +15 volts across winding 411 of transformer 409 with positive polarity at the upper end thereof. A potential is immediately induced in the secondary winding 416 with positive polarity at the lower end thereof as shown. Current flows from this lower end through resistor 511, rectifier 514, the gate electrode to cathode electrode path of silicon controlled rectifier 516 (i.e., SCR 516), causing SCR 516 to fire. At the same time, a potential is induced in secondary winding 419 with positive polarity at the lower end thereof as shown, which results in a back-biased control electrode-cathode electrode circuit which is incidental.

When SCR 516 fires, as described above, a circuit can be traced from filtered +48 volts over inductor 524, the main anode-cathode path of 516, the 529–530 winding portion of ferroresonant transformer 528, and the center tap 531 to 0 volts, whereby approximately 48 volts is placed across the 529–530 winding portion of transformer 528 after a very short commutating interval with the upper end of the winding positive.

At the same time, positive potential across commutating capacitor 527 makes the cathode electrode of SCR 522 positive with respect to its anode electrode, turning SCR 522 off.

Almost simultaneously with the switching on of transistor 401, transistor 402 is switched off with no significant control function being accomplished thereby at this time.

Transistor 462 Switches On

Transistor 461 Switches Off

When transistor 462 switches on, +15 volts is abruptly placed across winding 473 with positive polarity at the lower end thereof, and a potential is immediately induced in the secondary winding 479 with positive polarity at the upper end thereof. Current flows from this upper end through resistor 577, rectifier 580, the gate electrode to cathode electrode path of SCR 582, causing SCR 582 to fire.

At the same time, a potential is induced in secondary winding 476 with positive polarity at the upper end which results in a back-biased control electrode-cathode electrode circuit which is incidental.

When SCR 582 fires, approximately +48 volts (filtered) is placed across the 592–593 winding portion of ferroresonant transformer 588 after a very short commutating interval. At the same time, positive potential across commutating capacitor 587 makes the cathode electrode of SCR 576 positive with respect to its gate electrode, turning SCR 576 off.

Almost simultaneously with the switching on of transistor 462, transistor 461 is switched off with no significant control function at this time.

In this manner, the SCR's are switched on in the following order, each SCR when it switches on being operative to turn its associated SCR off: 516, 582, 546, 522, 576, 552, 516.

Rectifiers, such as 525, 526, in phase A return reactive current back to the D.C. source.

Rectifiers, such as 525A, 526A, in phase A enable the circuit to retain the desired charge on the capacitors, such as 527, to effect commutation.

The operation of an SCR power inverter is described in more detail in the Westinghouse Silicon Controlled Rectifier Design Handbook, 1st Edition, Section 7.2.

As a result of the above described sequence, three continuous square wave signals, 120 degrees apart, are fed into the primaries of transformers 528, 558, and 588. The signals generate the output waveforms as shown in FIGURE 7A. The specific relation accomplished by the firing of the SCR's is as follows:

SCR 516 creates the leading edge of the Phane A signal.

SCR 582 creates the trailing edge of the Phase C signal.

SCR 546 creates the leading edge of the Phase B signal.

SCR 522 creates the trailing edge of the Phase A signal.

SCR 576 creates the leading edge of the Phase C signal.

SCR 552 creates the trailing edge of the Phase B signal.

A sequence chart of the system operation in effecting the signal generation is set forth below.

Flip-flop A set

+209 −210
+226 −227
+VS
+303
+301 −302
VA (+5 v.), VA′ (+15 v.)
Prepares 354
+401 −402
+516 −522
Phase A Square Wave
Leading Edge Flip-flop C reset +210 −209
+227 −226
+VS′
+354
+352 −351
VC′ (+5 v.) VC (+15 v.)
Prepares 333
+462 −461
+582 −576
Phase C Square Wave
Trailing Edge Flip-flop B set +209 −210
+226 −227
+VS
+333
+331 −332
VB (+5 v.) VS′ (+15 v.)
Prepares 304
+431 −432
+546 −552
Phase B Square Wave
Leading Edge Flip-flop A reset +210 −209
+227 −226
+VS′
+304
+302 −301
VA′ (+5 v.) VA (+15 v.)
Prepares 353
+402 −401
+522 −516
Phase A Square Wave
Trailing Edge Flip-flop C set +209 −210
+226 −227
+VS
+353
+351 −352
VC (+5 v.) VC′ (+15 v.)
Prepares 334
+461 −462
+576 −582
Phase C Square Wave
Leading Edge Flip-flop B reset +210 −209
+227 −226
+VS′
+334
+332 −331
VB′ (+5 v.) VB (+15 v.)
Prepares 303
+432 −431
+552 −546
Phase B Square Wave
Trailing Edge Flip-flop A set

+209 −210

The square wave input signals to the primaries of 528, 558, and 588 are illustrated in FIGURE 7B. In FIGURE 7B, it will be seen that each signal has four modes.

Briefly, in mode 1, there is a higher frequency operation because of the higher frequency start circuit in the oscillator of FIGURE 2 and the amplitude gradually increases as condenser 110 in FIGURE 1 charges upon start for approximately 6–7 cycles of the oscillator. In mode 2, the higher frequency operation is still experienced but normal signal amplitude occurs because condenser 110 has charged. In mode 3 the frequency is gradually decreasing as condenser 219 (FIGURE 2) charges, and normal amplitude occurs because condenser 110 has charged. In mode 4, which is steady state operation, normal frequency and normal amplitude will occur.

It should be observed that the area under the curve is reduced in operating modes 1, 2, and 3 to thereby effect reduced flux in transformers 528, 558, and 588 upon starting. That is, the present invention is directed to the provision of circuitry for, and a novel method of, starting semiconductor inverters and converters when the input terminals are isolated from the output terminals by means of a magnetic component. During normal operation, the flux density, B, in a magnetic component operates about zero and between the design limits of plus and minus B*m*. With no excitation, the residual flux density, B*r*, is approximately zero or close to zero for grain oriented silicon steel or equivalent. Under these initial conditions, the magnetic component could be excited to nearly plus 2B*m* in the first half cycle which is normally greater than the saturation flux density, B*s*, causing high magnetizing currents to flow. These saturation currents are so high that the semiconductors being used can be destroyed from overheating, even though they are well within their ratings during steady state operation. Also in SCR type of inverters where energy storage means are used to commutate the SCR's it is possible that these large currents may result in failure to commutate and possible component failure.

To limit these saturation currents, the operating flux density, B*m*, of the magnetic component could be designed for less than or equal to *Bs*/2 depending on B*r*. Or, in the case of silicon controlled rectifier inverters and converters, the saturation currents could be limited by reducing the operating flux density, B*m*, and increasing the commutating choke. Because of the increased size and cost involved, limiting the saturation currents by these methods alone restrict their usage. Also, increasing the commutating choke to limit the large surge currents due to magnetic saturation may seriously affect steady state voltage waveforms.

Figure 5:
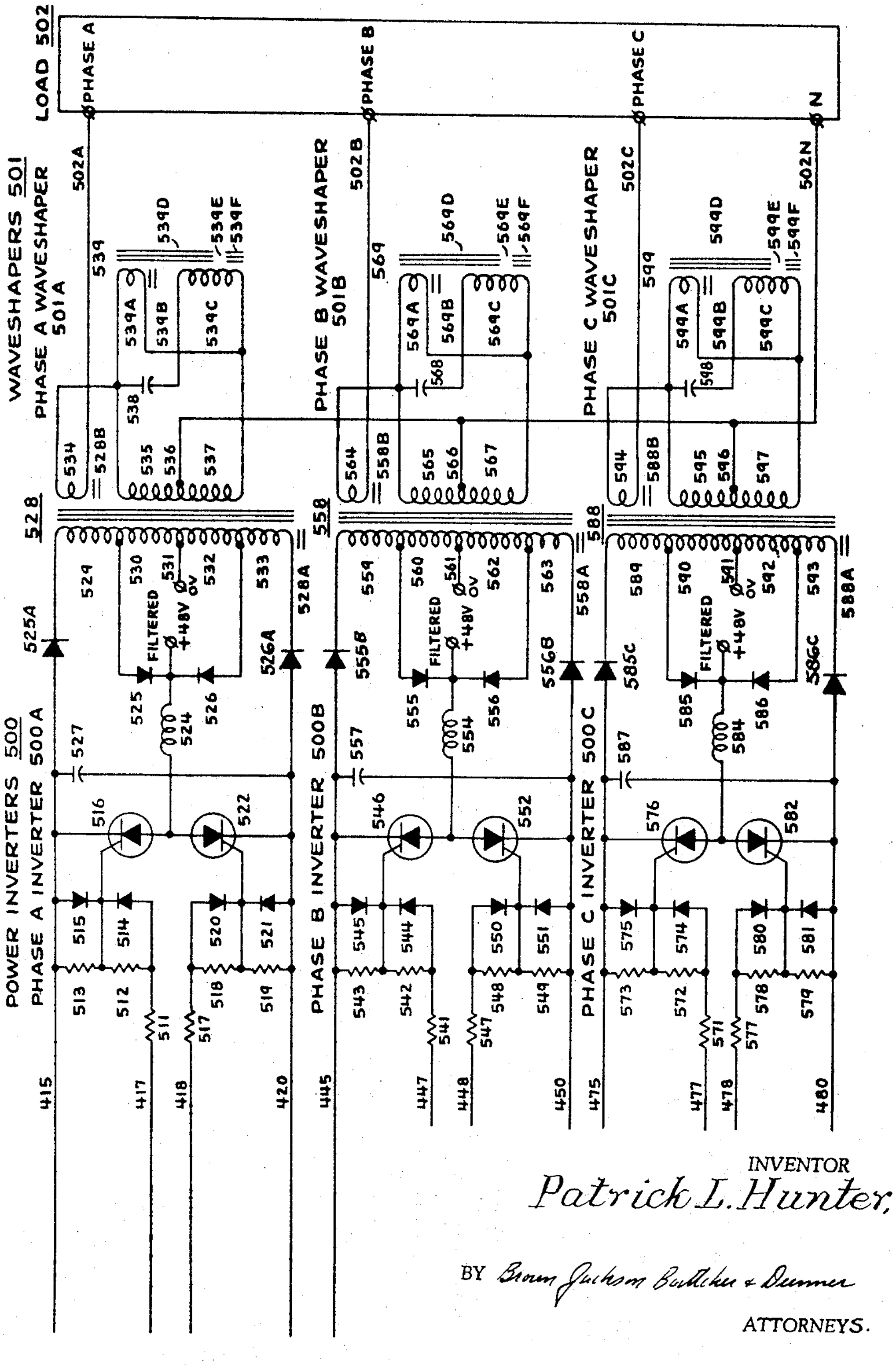
FIGURE 5 illustrates power inverters and wave shapers for the three phase output.

*Waveshapers—FIGURE 5*

As described hereinabove, three continuous square wave signals, displaced successively by 120 degrees, are fed into transformers 528, 558, and 588 of the waveshapers 501A, 501B, and 501C respectively. Each waveshaper, such as 501A for Phase A, comprises a ferroresonant voltage regulator, such as 528, and a further transformer, such as 539.

The inputs to the primary windings of 528 have been described. The secondary windings, such as 535–537, in Phase A are tapped at point 536 which is not necessarily a center tap. The primary windings are loosely coupled to the secondary windings as indicated by magnetic shunt means 528A and 528B which include an air gap. The compensating winding 534 is tightly coupled to the primary windings but is loosely coupled to the secondary windings (as indicated by magnetic shunt means 528A, 528B including an air gap), and is in series with the secondary windings 535, 537 and opposed thereto.

Two circuits are connected in parallel with each secondary winding. The first circuit comprises a capacitor 538 connected in series with winding 539C, and the second circuit comprises winding 539A. Winding 539A is loosely coupled to winding 539C as indicated by magnetic shunt means 539B including air gap means. Also, as indicated by gap 539E there is provided a high reluctance magnetic path forming a return magnetic path for magnetic flux which links secondary winding 539C.

Output lead 502A from winding 534 is connected to the load 502 as the Phase A lead, output lead 502B from winding 564 is connected to the load as the Phase B lead, output lead 502C from winding 594 is connected to the load as the Phase C lead, and the taps 536, 566, and 596 are connected together over lead 502N to the load as the neutral wire.

The functioning of waveshapers similar to 501A, 501B, and 501C is described in detail in patent application Ser. No. 257,659. Briefly, however, as a result of the waveshaping provided by the waveshapers 501A, 501B, and 501C, the odd harmonics of the square waves input to the waveshapers are essentially removed providing essentially sine waves to the load spaced by 120 degrees so that the Phase A sine wave appears between leads 502A and 502N; the Phase B sine wave appears between leads 502B and 502N; and the Phase C sine wave appears between leads 502C and 502N.

The turns ratios of the transformers may be such as to provide 120 volt 60 cycle A.C. current to the load between a phase lead and neutral (with the values given hereinbelow for the oscillator of FIGURE 2). With an alternate choice of components for the oscillator and power inverter, a 120 volt 50 cycle A.C. current may be provided for the load. Actually, it should be emphasized that by the proper choice of components for the oscillator and power inverter, a wide range of frequencies may be provided to the load.

REPRESENTATIVE VALUES—D.C. POTENTIAL SUPPLY—FIGURE 1

| | | |
|---|---|---|
| **102** | ohms | 25 |
| **103** | | IN3314B |
| **104** | ohms | 104 |
| **105** | ohms | 750 |
| **106** | ohms | 300 |
| **107** | | IN3996A |
| **109** | microhenries | 175 |
| **110** | microfarads | 200,000 |
| **111** | | Westinghouse 366B |
| **112** | ohm | 1 |
| **113** | microfarads | 2500 |
| **114** | ohms | 20 |
| **115** | microfarads | 1250 |
| **116** | microfarads | 10 |
| **117** | microfarads | .47 |
| **118** | | 8.2K |
| **119** | ohms | 680 |
| **120** | ohms | 1600 |
| **121** | | 2N3133 |
| **122** | | 2N1770A |

OSCILLATOR—FIGURE 2 TRANSFORMER 201, NORTH ELECTRIC 6011697

Core—⅝ inch of E1–21 lamination, interleaved, 29 gauge, grain oriented steel.
Primary winding 202–204—504 turns of #33 wire, center tapped.
Feedback winding 205—42 turns of #33 wire.
Secondary winding 206–208—168 turns of #33 wire, center tapped.

INDUCTOR 205A, NORTH ELECTRIC 6220699

Core—½ inch of E1–21 lamination, 29 gauge, grain oriented steel. Butt stacked with .010 inch gap.
Winding 223–225—1440 turns of #32 wire, center tapped.

| | | |
|---|---|---|
| Transistors: | | |
| **209, 210** | | 2N3133 |
| **216, 226, 227** | | 2N1613 |
| Diodes: | | |
| **213–214** | | 1N645 |
| Capacitors: | | |
| **219** | mfd | 450 |
| **222** | mfd | 1 |
| Resistors: | | |
| **211, 212** | (each) | 2K |
| **215** | ohms | 220 |
| **217** | | 1.5K |
| **218** | | 15K |
| **220** | | 8.2K |
| **221** | ohm rheostat | 220 |
| **228** | ohms | 1620 |

RING COUNTER—FIRST STAGE

| | |
|---|---|
| 301, 302 | 2N1613 |
| 303, 304, 305, 306 | 2N3133 |
| 307, 321 | 12K |
| 308, 322 | 24K |
| 309, 320 ohms | 750 |
| 310, 319 | 10K |
| 311, 318 | 1K |
| 312, 316 | 4.7K |
| 313, 317 | 20K |
| 314, 315 ohms | 390 |

SECOND STAGE

Corresponding parts the same.

| | |
|---|---|
| 366, 368 | 1N645 |

THIRD STAGE

Corresponding parts the same.

| | |
|---|---|
| 367, 369 | 1N645 |

POWER AMPLIFIERS—PHASE A

| | |
|---|---|
| 401, 402 | 2N3133 |
| 403, 405 | 8.2K |
| 406, 408 | 1N645 |
| 409 | North Electric 6011845 |

Same for Phases B and C

POWER INVERTERS AND WAVESHAPERS

| | |
|---|---|
| 511, 517 | 75 ohms. |
| 512, 518 | 10K. |
| 513, 519 | 75 ohms. |
| 514, 515, 520, 521 | 1N1487. |
| 516, 522 | C55C. |
| 527 | 35 microfarads. |
| 525, 526 | 1N1186. |
| 528 | North Electric 6123864 plus the compensating winding 534. |
| 539 | North Electric 6123865. |
| 538 | 54 microfarads. |

*Miscellaneous*

The source 101 may comprise a battery eliminator or a power supply instead of the illustrated battery. In such event, the source 101 would have an alternating current input of a frequency which is different than the frequency output to the load 502, and in such case, the system would constitute a frequency converter.

Although particular embodiments of the invention have been shown and described, it is apparent that modifications and ateleration may be made, and it is intended in the appended claims to cover all such modifications and alterations as may fall within the true spirit and scope of the invention.

What is claimed is:

1. In a three-phase inverter circuit for converting direct current to alternating current, input means connected to a direct current source, an oscillator circuit connected to said input means for energization by said direct current including a pair of switches connected for cyclic energization, a transformer including a primary winding connected to the output of said switches, and a secondary winding, a feedback circuit for said switches including a feedback winding on said transformer, means connecting the output of said feedback winding to said switches including an inductor across an RC circuit connected in series with said inductor and said winding, a three-stage ring counter, a first and a second drive conductor connected to said secondary winding to provide a direct current coupled signal to said three-stage counter consisting of a polarity reversal at timed intervals, an output circuit for each stage of said ring counter, a plurality of power amplifiers, each of which is direct current coupled to a different output circuit, a plurality of power inverters, each of which is connected to a different one of said power amplifiers, a plurality of ferroresonant wave shaper circuits, each of which is connected to a different power inverter, and each of which comprises a ferroresonant transformer having a first core, a primary winding on said first core connected to the output of the associated power inverter, and a secondary winding on said first core for providing output signals, a second core, a first winding on said second core connected across said secondary winding on said first core, and a series circuit connected across said secondary winding on said first core including a capacitor and a second winding on said second core, and output means connected to said secondary windings for providing a three-phase power output from said ferroresonant wave shaper circuits.

References Cited

UNITED STATES PATENTS

| | | | |
|---|---|---|---|
| 2,984,753 | 5/1961 | Della Salle | 307—88.5 |
| 3,054,939 | 9/1962 | Thompson | 321—16 |
| 3,061,769 | 10/1962 | Smyth | 321—45 X |
| 3,200,321 | 8/1965 | Rosenstein | 321—3 |
| 3,256,495 | 6/1966 | Hunter | 331—113.1 |
| 3,259,827 | 7/1966 | Strohmeier et al. | 321—45 X |
| 3,264,548 | 8/1966 | King | 321—45 |

LEE T. HIX, *Primary Examiner.*

W. H. BEHA, Jr., *Assistant Examiner.*